(12) United States Patent
Kim

(10) Patent No.: US 7,372,746 B2
(45) Date of Patent: May 13, 2008

(54) LOW VOLTAGE SENSING SCHEME HAVING REDUCED ACTIVE POWER DOWN STANDBY CURRENT

(75) Inventor: Tae Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 179 days.

(21) Appl. No.: 11/205,659

(22) Filed: Aug. 17, 2005

(65) Prior Publication Data

US 2007/0041257 A1 Feb. 22, 2007

(51) Int. Cl.
*G11C 7/10* (2006.01)

(52) U.S. Cl. .................. 365/189.06; 365/205; 365/227

(58) Field of Classification Search .................. 326/30; 327/309, 318, 319, 320, 321; 365/154, 185.07, 365/185.08, 189.06, 205, 207, 226, 227, 365/229, 156, 228
See application file for complete search history.

(56) References Cited

U.S. PATENT DOCUMENTS

| | | | |
|---|---|---|---|
| 5,544,110 A * | 8/1996 | Yuh ........................... 365/205 |
| 5,646,900 A * | 7/1997 | Tsukude et al. ............ 365/205 |
| 6,242,948 B1 * | 6/2001 | Makino ........................ 326/81 |
| 6,301,178 B1 | 10/2001 | Derner et al. |
| 6,545,528 B2 | 4/2003 | Nishioka |
| 6,697,293 B2 | 2/2004 | Brennan et al. |
| 6,711,079 B2 | 3/2004 | Kang |
| 6,845,056 B2 | 1/2005 | Kinoshita |
| 6,850,454 B2 | 2/2005 | Kuge et al. |
| 6,999,338 B1 * | 2/2006 | Hirabayashi ................. 365/154 |
| 7,176,722 B2 * | 2/2007 | Park et al. ..................... 326/83 |
| 7,203,097 B2 * | 4/2007 | Choi et al. ............. 365/185.27 |
| 2006/0268628 A1 * | 11/2006 | Hirabayashi ........... 365/189.09 |
| 2007/0121358 A1 * | 5/2007 | Hirota et al. ................... 365/1 |

OTHER PUBLICATIONS

K. Hardee, F. Jones, D. Butler, M. Parris, M. Mound, H. Calender, G. Jones, L. Aldrich, C. Gruenschlaeger, M. Miyabayashi, K. Taniguchi, T. Arakawa, A 0.6V 205MHz 19.5ns. tRC 16Mb Embedded DRAM, ISSCC 2004, Session 11, Dram, 11.1.

\* cited by examiner

*Primary Examiner*—Richard T. Elms
*Assistant Examiner*—Alexander Sofocleous
(74) *Attorney, Agent, or Firm*—Edward L. Pencoske; Jones Day

(57) ABSTRACT

A low voltage sensing scheme reduces active power down standby leakage current in a memory device. During memory's active power down state, the leak current may increase because of the use of P and Nsense amplifiers having low threshold voltages (Vth) for low Vcc sensing of data signals. A clamping device or diode is used between a Psense amplifier control line (e.g. ACT) and Vcc and/or between an Nsense amplifier control line (e.g. RNL*) and Vss (ground potential). The clamping diode is not enabled during normal memory operations, but is turned on during active power down mode to reduce leakage current through ACT and/or RNL* nodes. The clamping device connected to the ACT node may reduce the voltage on the ACT line during power down mode, whereas the clamping device connected to the RNL* node may increase the voltage on the RNL* line during power down mode to reduce sense amplifier leakage current through these nodes.

18 Claims, 6 Drawing Sheets

LOW VOLTAGE SENSING SCHEME HAVING REDUCED ACTIVE POWER DOWN STANDBY CURRENT

BACKGROUND

1. Field of the Disclosure

The present disclosure generally relates to electronic devices and, more particularly, to a system and method to substantially reduce active power down standby current in semiconductor memory chips.

2. Brief Description of Related Art

Memory devices are electronic devices that are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins or ball contacts 24 located outside of chip 12 for electrically connecting the chip 12 to other system devices. Some of those pins 24 may constitute memory address pins or address bus 17, data (DQ) pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address strobe (RAS) signal, a column address strobe (CAS) signal, a chip select (CS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in an array of rows and columns. A row decode circuit 28 and a column decode circuit 30 may select the rows and columns, respectively, in the array in response to decoding an address provided on the address bus 17. Data to/from the memory cells 26 are then transferred over the data bus 18 via sense amplifiers and a data output path (not shown). A memory controller (not shown) may provide relevant control signals (not shown) on the control bus 19 to control data communication to and from the memory chip 12 via an I/O (input/output) circuit 32. The I/O circuit 32 may include a number of data output buffers or output drivers to receive the data bits from the memory cells 26 and provide those data bits or data signals to the corresponding data lines in the data bus 18. The I/O circuit 32 may also include various memory input buffers and control circuits that interact with the row and column decoders 28, 30, respectively, to select the memory cells for data read/write operations.

The memory controller (not shown) may determine the modes of operation of memory chip 12. Some examples of the input signals or control signals (not shown in FIG. 1) on the control bus 19 include an External Clock (CLK) signal, a Chip Select (CS) signal, a Row Address Strobe (RAS) signal, a Column Address Strobe (CAS) signal, a Write Enable (WE) signal, etc. The memory chip 12 communicates to other devices connected thereto via the pins 24 on the chip 12. These pins, as mentioned before, may be connected to appropriate address, data and control lines to carry out data transfer (i.e., data transmission and reception) operations.

FIG. 2 is a simplified architecture for a portion of the memory device 12 shown in FIG. 1. It is evident that complex circuit details and constituent architectural blocks in the memory chip 12 are omitted from FIG. 2 for the sake of clarity and ease of illustration. As shown in FIG. 2, a data storage or memory array may consist of a matrix of storage bits or memory cells 26 divided into a left memory array 34 and a right memory array 36. Each memory bit being exclusively addressed by a corresponding row and column address (that may be present on the address bus 17). Each row of memory cells may be accessed by a "wordline" (WL), whereas each column of memory cells may be accessed by a "digitline" (DL). Each memory bit or memory cell 26 may be connected to only one corresponding digitline and only one corresponding wordline. In FIG. 2, for ease of illustration, each memory array is shown with one wordline—the wordline 38 in the left array 34 and the wordline 40 in the right array 36. Similarly, each memory array is shown with two digitlines—the digitlines 42 and 44 in the left array 34 and the digitlines 46 and 48 in the right array 36. It is noted that the digitlines 44 and 48 are denoted as "DL*" to indicate the paired nature of the digitlines 42 and 44, and 46 and 48, as is known in the art.

In FIG. 2, two equilibration (EQ) circuits 50 and 52 are shown—each one connected to a corresponding pair of digitlines. Thus, the EQ circuit 50 performs equilibration of digitlines 42 and 44 to the DVC2 voltage level (=Vcc/2 V) before a memory cell access or data sensing operation begins, as is known in the art. Similarly, the EQ circuit 52 equilibrates the paired digitlines 46 and 48 to the DVC2 voltage level. A sense amplifier circuit including a pair of cross-coupled PMOS (p-channel metal oxide semiconductor) transistors 54 (P1), 56 (P2), and a pair of cross-coupled NMOS (n-channel MOS) transistors 58 (N1), 60 (N2), connected as depicted in FIG. 2, is shown placed between the four digitlines 42, 44, 46, and 48 and operating on them to perform the data sensing operation as is known in the art. The PMOS transistor pair P1-P2 may be called "Psense-amplifiers" and the NMOS transistor pair N1-N2 may be referred to as "Nsense-amplifiers."

The Psense- and Nsense-amplifiers 54, 56, 58, 60 work together to detect the data signal voltage in a memory cell and drive the associated digitlines accordingly to Vcc and ground (GND). For example, in case of the digitlines 42 and 44, the Nsense-amplifiers 58, 60 may drive the low potential digitline (e.g., the digitline 44) to ground and the Psense-amplifiers 54, 56 may drive the high-potential digitline (e.g., the digitline 42) to Vcc. The operation of the sense amplifier circuit (consisting of transistor pairs P1-P2 and N1-N2) may be controlled by a pair of sense amplifier control lines—the ACT (activation) line or signal 61 and the RNL* (Row Nsense Latch) line or signal 62 connected as shown in FIG. 2. The ACT line 61 may be active "high" whereas the RNL* signal may be active "low." Thus, for example, the Psense-amplifiers may be activated when the ACT signal is at a Vcca level (Vcc voltage for the array) or "high", whereas the Nsense-amplifiers are turned on when the RNL* signal goes to logic zero or ground level.

Isolation (ISO) devices are also important during data storage and sensing operations. These devices are generally NMOS transistors placed between the array digitlines and the sense amplifiers. In FIG. 2, the isolation transistors 64-65 are placed and can control the connection between the digitlines 42 and 44 in the left memory array 34 and the P-N sense amplifier circuitry (consisting of transistor pairs P1-P2 and N1-N2 as noted above), whereas the isolation transistors 67-68 are placed to control the connection between the digitlines 46 and 48 in the right memory array 36 and the P-N sense amplifier circuitry (or P1-P2 and N1-N2 transistor pairs). In other words, if digitline nodes X1 and X2 (not shown) were added in the sense amplifier circuitry in FIG. 2 to correspond with the digitline pair DL-DL*, respectively, the isolation transistor 64 is placed between digitline 42 in the left array and the node X1 and the isolation transistor 67 is placed between the node X1 and the digitline 46 in the right array. Similarly, the isolation transistor 65 is placed between the digitline 44 and the node X2 and the isolation transistor 68 is placed between the node X2 and the digitline 48.

The isolation transistors may function to electrically isolate the two memory arrays 34, 36 so that whenever a wordline fires in one of the arrays, the digitline capacitance in that array is reduced because of the isolation of the other array. Further, the isolation transistors may provide resistance between the adjacent P or Nsense amplifier and the associated digitlines. This resistance may stabilize the sense amplifiers and speed up the data sensing operation by isolating the highly capacitive digitlines. In FIG. 2, the activation/deactivation of isolation transistors is shown controlled by the application of the ISOL signal 66 and the ISOR signal 69 to the corresponding gates of the isolation transistors. The ISOL signal 66 controls the isolation transistors 64-65 for the left array 34, whereas the ISOR signal 69 controls the isolation transistors 67-68 for the right array 36.

FIG. 2 also illustrates the voltage levels of various signals or circuit lines during a memory standby state (e.g., after a row precharge operation is over, but before the row is fired or activated to commence a data access operation thereon). Both the isolation signals—the ISOL signal 66 and ISOR signal 69—may be held at the Vccp level during a row precharge or standby state. As is known in the art, the Vccp voltage level is more than the memory chip's operating voltage level or the "Vcc" level by at least Vth (threshold voltage) of a MOS transistor (NMOS or PMOS). It is known in the art that modern memory circuit designs employ a negative wordline voltage (VNWL) (not shown) to reduce the memory cell leakage current when the corresponding wordline is "off" or "inactive" and to also improve the memory cell refresh characteristics. In FIG. 2, a prior art scheme of maintaining digitlines and wordlines in a memory array in a standby state (e.g., a memory row precharged state) is illustrated via the exemplary voltages illustrated on certain lines. As shown in FIG. 2, during a standby state (i.e., when a row is not fired to commence a data access operation thereon and when sense amplifiers are inactive), the ACT signal line 61 is held at a ground potential (here, at 0V), and the RNL* signal 62 is maintained at the Vcc/2 or DVC2 voltage level. During the standby state, the wordlines (e.g., the wordline 38) are precharged to the VNWL level, which, in case of the embodiment in FIG. 2, is negative 0.3 V (−0.3V). However, the digitlines (e.g., the DL 42 and DL* 44) are precharged to the Vcc/2 (or DVC2) voltage level during the standby state. A wordline may be fired when a Vccp voltage level is applied at the wordline (WL signal). Voltage levels for other signals and lines in FIG. 2 during a memory active state (e.g., when a wordline is fired) are not relevant here, and, hence, are not discussed for the sake of brevity.

FIG. 3 shows a prior art circuit scheme to establish desired voltage levels on the sense amplifier control lines (the ACT line 61 for the pair of Psense-amplifiers 54, 56, and the RNL* line 62 for the pair of Nsense-amplifiers 58, 60) of FIG. 2 during memory active and power-down states/modes. It is noted here that during a memory active state (e.g., when a data access operation can be performed), the sense amplifiers P1-P2, N1-N2 are also active; but during a memory stand-by state, the sense amplifiers P1-P2, N1-N2 are not active. While the memory 12 is in its active state, the memory chip 12 may be placed in the memory power-down mode to conserve power, for example, when a memory bank activation is for a long period of time. Thus, in the memory's active power-down mode, the sense amplifiers P1-P2, N1-N2 may remain activated. The memory power-down mode may be contrasted with the memory "sleep" mode where not only the sense amplifiers, but additional circuits in the memory chip 12 may also be placed in an inactive state. It is observed here that a memory controller (not shown) may determine to place the memory chip 12 in a power-down mode (which may be of a longer duration than the routine stand-by mode discussed hereinbefore) to conserve power, especially, for example, when there is a prolonged delay anticipated for a memory access operation, or when the controller is instructed by a microprocessor (not shown) in the system to force the memory chip 12 in the power-down mode.

In FIG. 3, in addition to the P and Nsense amplifier pairs P1-P2 and N1-N2, a pair of driver transistors 70 and 72 are shown connected to corresponding sense amplifier control line "nodes." For ease of discussion, the ACT line and the ACT line node (where the drain terminal of the PMOS transistor 70 is connected) are referred to by the same reference numeral "61", and the RNL* line and the RNL* line node (where the drain terminal of the NMOS driver transistor 72 is connected) are also referred to by the same reference numeral "62." A PSA (Psense amplifier activation) signal 73 may be supplied to the gate terminal of the driver transistor 70, and an NSA (Nsense amplifier activation) signal 74 may be supplied to the gate terminal of the other transistor 72. In FIG. 3, the PSA signal 73 is active "low" and the NSA signal 74 is active "high." Therefore, a low level on the PSA signal 73 will turn on the PMOS 70, thereby establishing a Vcc (supply voltage) level on the ACT node (or line) 61. Similarly, a high level on the NSA signal 74 will turn on the NMOS 72, thereby establishing a ground potential (GND) on the RNL* node (or line) 62. Thus, it is seen from the arrangement in FIG. 3, that the sense amplifier control lines may have opposite potential levels during a memory's active or power-down states. Thus, the voltage on the ACT line 61 may be maintained at a Vcc level during the memory's 12 active and power-down states, but at the ground potential (GND) during the memory standby state as discussed before. On the other hand, the RNL* line 62 may be placed at the ground potential during the memory's active and power-down states, but at the DVC2 (Vcc/2 V) level during the memory standby state as discussed before. The schematic in FIG. 3 is simplified to illustrate only the transistors 70 and 72 connected to the lines 61 and 62, respectively, for applying appropriate voltage levels to the control lines 61-62 during memory active and power-down modes. In practice, as is known in the art, there may be additional driver and logic circuitry associated with each sense amplifier control line 61-62 to apply appropriate voltage levels on the control lines during the memory's stand-by state.

Low power embedded DRAM (Dynamic Random Access Memory) is an increasingly popular solution for mobile personal consumer applications requiring high-speed graphics and long battery life. For example, such memory devices are preferred in mobile phones, PDA's (Personal Digital Assistants), laptop computers, etc., where reduced power requirement or consumption and longer battery life are highly in demand. It is known in the art that the power consumption in a memory device may be reduced by lowering the system supply voltage (Vcc). However, such low supply voltage operation requires reducing the transistor threshold voltages (Vth). Thus, for example, replacing the transistors 54, 56, 58, and 60 by transistors with low or reduced threshold voltages (Vth) will allow low-Vcc sensing operations in the memory chip 12. But, reducing the transistor threshold voltage (Vth) results in increased transistor off current and higher standby power consumption. A low threshold (Vth) transistor in the sense amplifier circuit may produce a relatively big leak current when the sense amplifier is activated (for example, during a memory's active state or power-down state).

It is therefore desirable to devise a memory circuit configuration where low-Vcc sensing scheme may be employed using reduced-Vth sense amplifier transistors, but without increasing the standby current (Idd3) during the memory's active power-down mode. In one prior art method, the power-down standby leakage current (Idd3) from the low-Vth sense amplifiers is reduced by applying a voltage above Vcc level to the PSA line 73 and a voltage below the ground potential to the NSA line 74 during the power down mode. However, such configuration requires periodically exiting the power down mode and performing frequent burst refresh cycles in the memory device to prevent data loss. In another prior art method, the bias voltage for the substrate of the semiconductor memory chip 12 is controlled to reduce the standby leakage current. However, these prior art methods are cumbersome and complicated to implement. These methods may also result in additional memory circuitry to perform various monitoring and control functions, thereby increasing the chip real estate.

Hence, it is desirable to devise a low voltage (Vcc) sensing scheme in a memory device using sense amplifiers with low threshold voltages (Vth) and having reduced standby current (Idd3) during the memory's active power down mode. It is preferred that the sensing scheme be implemented without significant modifications to the sense amplifier layout in a memory chip and without any complex data loss prevention measures.

SUMMARY

The present disclosure contemplates a method of operating a circuit within a memory device. The method comprises maintaining a first voltage level on a sense amplifier control line in the memory device before placing the memory device in a power down mode and, upon placing the memory device in the power down mode, applying a second voltage level to the sense amplifier control line using a voltage clamping device connected to the sense amplifier control line.

In one embodiment, the present disclosure further contemplates a method of operating a circuit within a memory device. The method comprises generating a first signal to place a first voltage level on a sense amplifier control line in the memory device before placing the memory device in a power down mode and, upon placing the memory device in the power down mode, generating a second signal to apply a second voltage level to the sense amplifier control line using a voltage clamping device connected to the sense amplifier control line.

In another embodiment, the present disclosure contemplates a method of operating a circuit within a memory device. The method comprises maintaining a first voltage level on a sense amplifier control line in the memory device before placing the memory device in a power down mode, and transitioning the first voltage level to a second voltage level using a voltage clamping device connected to the sense amplifier control line when the memory device is placed in the power down mode.

In a further embodiment, the present disclosure contemplates a sense amplifier circuit in a memory device. The circuit comprises a pair of sense amplifiers and a pair of sense amplifier control lines connected to the pair of sense amplifiers and configured to control activation and deactivation of the pair of sense amplifiers. The circuit further comprises a switching device connected to one of the sense amplifier control lines to maintain a first voltage level on the sense amplifier control line before the memory device enters a power down mode; a voltage clamping device connected to the sense amplifier control line to change the first voltage level thereon to a second voltage level when the memory device enters the power down mode; and a control circuit connected to the switching device and the voltage clamping device to control operations thereof. The control circuit is configured to turn on the switching device and turn off the voltage clamping device prior to the power down mode. The control circuit is further configured to turn off the first switching device and turn on the voltage clamping device during the power down mode.

In an alternative embodiment, the present disclosure contemplates a memory device. The memory device comprises a plurality of memory cells arranged in an array of rows and columns to store data therein. The memory device also comprises a plurality of peripheral devices for reading information from said data cells. The peripheral devices include sense amplifier circuits, wherein each sense amplifier circuit is connected to a respective pair of the columns in the array to sense data signals received from corresponding memory cells. Each sense amplifier circuit may include a voltage clamping device and a corresponding control circuit as described in the preceding paragraph. A system according to one embodiment of the present disclosure contemplates such memory device connected to a processor via a bus. The memory device stores therein data received from the processor over the bus and sends data stored therein to the processor via the bus.

The present disclosure thus describes a low voltage sensing scheme that reduces active power down standby leakage current in a memory device. During memory's active power down state, the leak current may increase because of the use of P and Nsense amplifiers having low threshold voltages (Vth) for low Vcc sensing of data signals. A clamping device or diode is used between a Psense amplifier control line (e.g. ACT) and Vcc and/or between an Nsense amplifier control line (e.g. RNL*) and Vss (ground potential). The clamping diode is not enabled during normal memory operations, but is turned on during active power down mode to reduce leakage current through ACT and/or RNL* nodes. The clamping device connected to the ACT node may reduce the voltage on the ACT line during power down mode, whereas the clamping device connected to the RNL* node may increase the voltage on the RNL* line during power down mode to reduce sense amplifier leakage current through these nodes. The voltages on ACT and RNL* lines go back to their original levels when the memory device exits the power down mode. Clamping devices can be implemented without significant modifications to the sense amplifier layout in a memory chip and without any complex data loss prevention measures.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "coupled," "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuits discussed herein may be easily implemented in negative logic (i.e., a high value on a signal is treated as a logic "0" whereas a low value is treated as a logic "1"). Similarly, the terms "Vcc" and "Vccp" are used to refer to positive operating voltages in a circuit as is known in the art, and the term "GND" is used to refer to a common circuit ground potential (which may or may not be zero) as is known in the art. The Vcc, Vccp, and GND potentials may be considered as substantially fixed voltage levels in an electronic circuit.

It is noted at the outset that the terms "power down mode" and "active power down mode" are used interchangeably herein to refer to a power saving state or mode in which a memory device may be placed during its active state of operation. The terms "mode" and "state" (as, for example, in "power down mode" or "power down state") are also used herein interchangeably. As discussed hereinbefore, various sense amplifiers in a memory device may remain activated during the memory's power down mode. Further, as also discussed hereinbefore, a memory's power down state can be distinguished from the memory's standby state. Various circuits discussed hereinbelow with reference to FIGS. 4, 6, and 8 may be used to reduce standby leakage current (Idd3) attributable to memory sense amplifiers during memory's active power down mode.

Figure 3:
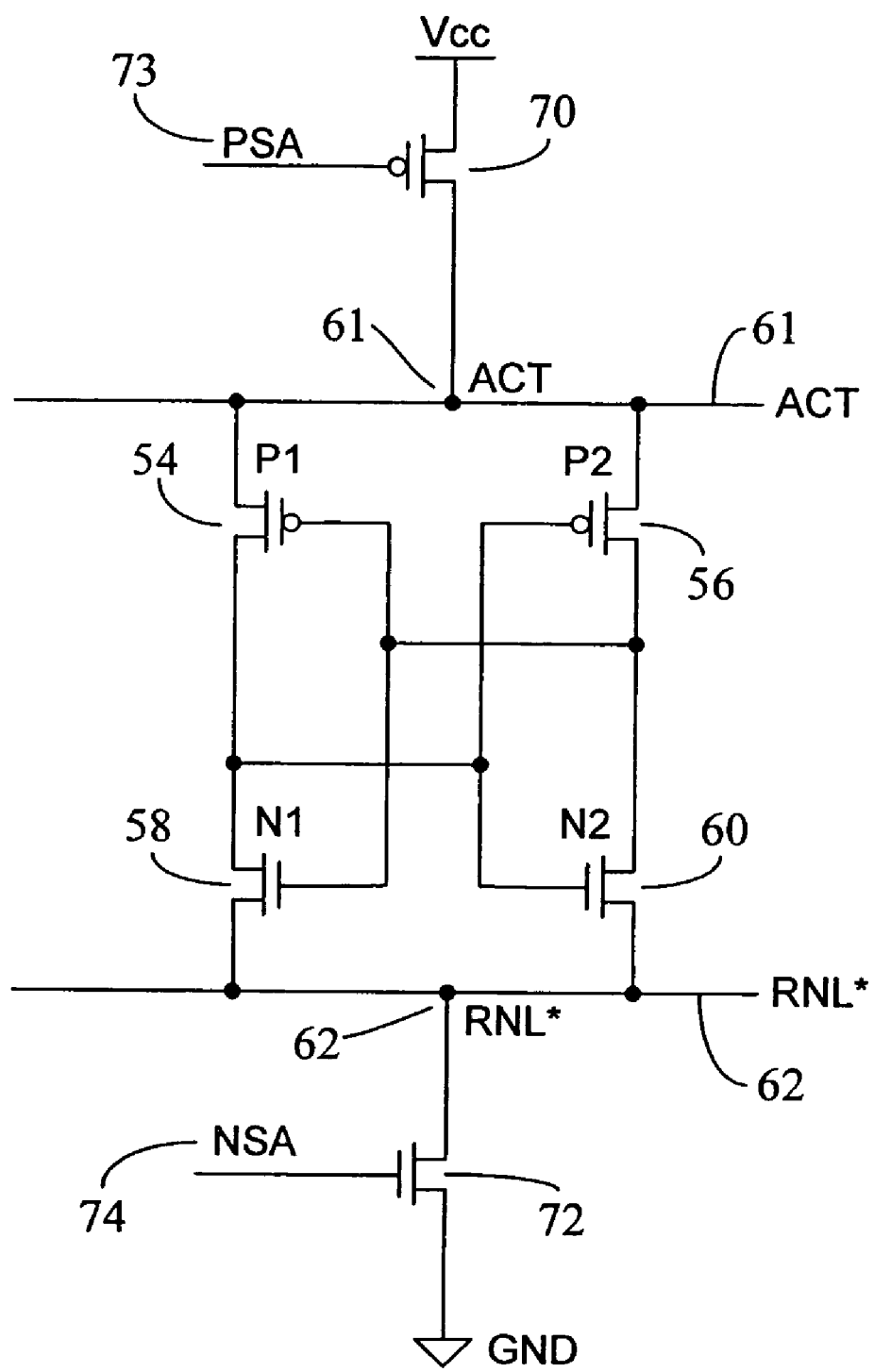
FIG. 3 shows a prior art circuit scheme to establish desired voltage levels on the sense amplifier control lines of FIG. 2 during memory active and power-down states.
Figure 4:
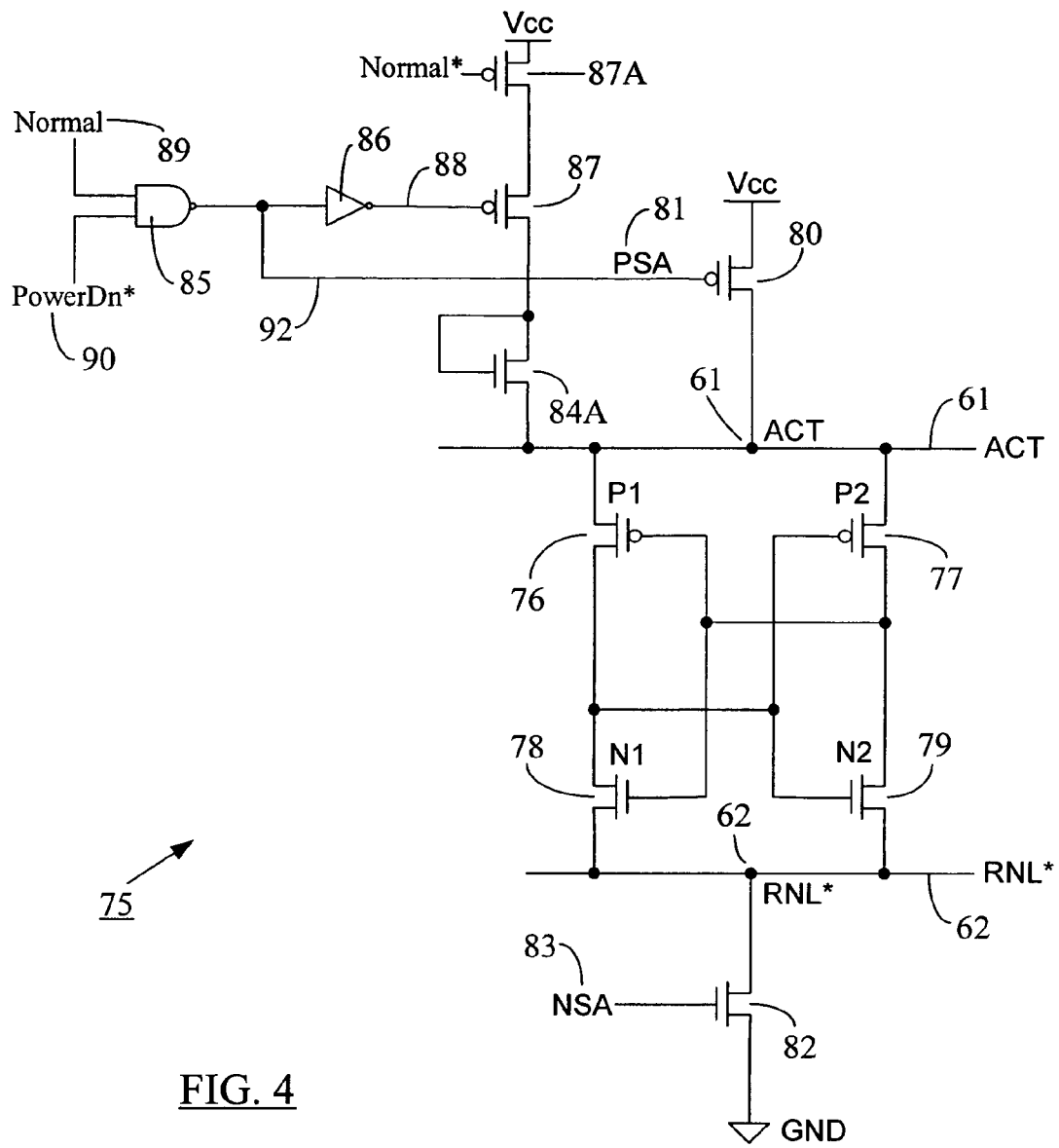
FIG. 4 is an exemplary circuit configuration according to one embodiment of the present disclosure illustrating a clamping device-based power-down leakage current control mechanism for a Psense amplifier control line.

FIG. 4 is an exemplary circuit configuration 75 according to one embodiment of the present disclosure illustrating a clamping device-based power-down leakage current control mechanism for a Psense amplifier control line (here, the ACT line 61). Similar to the circuits in FIGS. 2-3, the circuit 75 in FIG. 4 may be part of a memory chip's internal architecture as discussed later hereinbelow with reference to FIG. 9. In FIG. 4, the Psense amplifiers 76-77 and the Nsense amplifiers 78-79 may have lower or reduced threshold voltages (Vth) than the sense amplifiers 54, 56, 58, 60 in FIGS. 2-3. For ease of discussion, the Psense amplifier control line (i.e., the ACT signal) in FIG. 4 is referenced with the same reference numeral "61" as that used in FIGS. 2-3. Similarly, the Nsense amplifier control line (i.e., the RNL* signal) in FIG. 4 is referenced with the same reference numeral "62" as that used in FIGS. 2-3. It is evident to one skilled in the art that the ACT 61 and RNL* 62 lines in FIGS. 2-4 perform identically. The ACT node 61 and the RNL* node 62 are also shown in FIG. 4. The driver transistors 80, 82 are shown along with respective activation signal lines PSA 81 and NSA 83. Except for the usage of low threshold voltage (Vth) CMOS (Complementary Metal Oxide Semiconductor) transistors in the sense amplifier pairs P1-P2, N1-N2 in FIG. 4, the operation and functionality of circuit elements 76-79, 80, 82, and the signals 61-62, and 81, 83 in FIG. 4 may be identical to the operation of corresponding circuit parts in FIG. 3 and, hence, additional discussion of these circuit parts in FIG. 4 is not provided herein for the sake of brevity.

In the circuit configuration 75 of FIG. 4, a clamping device 84A is shown connected to the Psense amplifier control line ACT 61 to accomplish reduction in active power down standby current as discussed in more detail hereinbelow. In the embodiment of FIG. 4, the activation/deactivation of the clamping device 84A and the driver transistor 80 may be controlled by a control circuit or logic unit comprising, for example, a NAND gate 85 and an inverter 86 as shown. In the embodiment of FIG. 4, the clamping device 84A is an NMOS (N-channel MOS) transistor with its source terminal connected to the ACT line 61, and its gate and drain terminals are connected together and also to the supply voltage (Vcc) through an intervening PMOS (P-channel MOS) transistor 87. The NMOS transistor 84A functions as a diode clamping device and reduces voltage on the ACT line 61 as discussed later hereinbelow. It is observed here that a PMOS transistor or any other suitable semiconductor switching device may be used as the diode clamping device 84A with suitable circuit modifications as may be evident to one skilled in the art. The output 88 of the inverter 86 may be supplied to the gate terminal of the PMOS 87 to turn on the NMOS clamping device 84A during the power down mode as discussed below. The drain terminal of PMOS 87 is connected to the junction of the gate and drain terminals of NMOS clamp 84A, and the source terminal of PMOS 87 is connected to Vcc through a PMOS transistor 87A (whose gate terminal receives the Normal* signal which is the complement of the Normal mode signal 89) as shown in FIG. 4.

The clamping operation may be controlled through the NAND gate 85 based on the logic levels of two signals input to the NAND gate 85—the Normal mode signal 89, and the power down mode signal (PowerDn*) 90. In the embodiment of FIG. 4, the Normal mode signal 89 is an active "high" signal, whereas the PowerDn* signal 90 is an active "low" signal. The Normal mode signal 89 may remain asserted (i.e., in the logic "high" or "1" state) and the PowerDn* signal 90 may remain de-asserted (i.e., in the logic "high" or "1" state) so long as the memory device (not shown here, but shown in FIG. 9) containing the circuit configuration 75 is in the active state. When the memory device enters the active power down mode, the PowerDn* signal 90 may be asserted (i.e., logic "0" or "low" state) and the Normal input 89 may be de-asserted (i.e., logic "0" or "low" state). However, the logic level of the Normal input 89 may not affect the output of the NAND gate 85 once the Power Dn* signal is active. In one embodiment, the Normal 89 and PowerDn* 90 signals may be supplied by an external memory controller (not shown) as part of the control signals to the memory chip. In an alternative embodiment, these signals may be generated internally in the memory device based on a state indication (e.g., an active state, or an active power down state) received from the memory controller (not shown). In any event, it is seen that so long as both the inputs 89-90 of the NAND gate 85 are "high" or "1" (as, for example, in a memory's active state), the output 92 (which is supplied as the PSA signal 81) of the NAND gate remains "low" and the output 88 of the inverter 86 remains "high", thereby turning on the PMOS 80, but keeping the PMOS 87 turned off. When the PSA signal 81 turns on the PMOS 80, the supply voltage Vcc is applied to the ACT node 61. Thus, the ACT line 61 is held at the Vcc level during the memory's active state.

However, during the active power down mode, the PowerDn* input 90 is asserted "low" (logic "0" level). Thus, the output 92 of the NAND gate 85 goes to the "high" or logic "1" state irrespective of the logic level of the Normal input 89. The "high" state of the output line 92 is applied as the PSA signal 81 to the PMOS 80, thereby turning off the PMOS 80. However, the second output 88 of the NAND-inverter logic combination is now in the logic "low" or "0" state, thereby turning on the PMOS 87. When the PMOS 87 is turned on, it also enables the clamping device 84A. The conduction through the clamping diode 84A reduces the voltage applied to the ACT node or line 61 from the Vcc level (as was the case during the memory's active state) to the Vtp level (=Vcc minus Vth (of NMOS 84A)). Thus, during a memory power down mode, the previously held Vcc level at the ACT node 61 may transition to a lower than Vcc voltage level (Vtp level) when the NMOS clamping diode 84A is activated. A reduced voltage on the ACT line 61 thus reduces active power down standby current (Idd3) when sense amplifiers 76-79 are turned on for a long period of time. The leakage current through the ACT node 61 is reduced because the ACT node voltage is lower than the active state voltage level of Vcc.

It is observed here that a too low a voltage on the ACT node 61 may result in insufficient voltage levels in the sense amplifier circuits in a memory device (not shown) and, hence, may result in possible data loss during data sensing and transfer operations. However, in the embodiment of FIG. 4, the reduction of voltage at the ACT node 61 from Vcc to Vcc-Vth (of NMOS 84A) is small enough to avoid any such data loss associated with other prior art leakage current reduction mechanisms, yet large enough to achieve significant reduction in active power down standby current. For example, it may be desirable to obtain a value of 20 mA for Idd3 in a memory chip. However, when sense amplifiers with low threshold voltage (Vth) (e.g., sense amplifiers similar to the transistors 76-79 in FIG. 4) are used in a memory chip, the leakage current may increase when sense amplifiers are activated for a long time (e.g., when a memory bank/array remains activated for a long time). The sense amplifier leakage current may contribute to the increase in the overall active power down standby current (Idd3), which, in some cases, may be close to 50 mA. As discussed above, by using a clamping device similar to the NMOS diode 84A, the ACT line 61 may be clamped at a voltage lower than Vcc during the power down mode, thereby reducing leakage current through the ACT node 61. Thus, when a sense amplifier configuration similar to the configuration 75 of FIG. 4 is used, the clamping diode 84A-based voltage reduction on sense amplifier control lines may assist in obtaining a value of 20 mA for Idd3 even when there are low-Vth P and Nsense amplifiers present in the circuit 75. Thus, the specification value for Idd3 may still be obtained even when low-Vth transistors are used in memory sense amplifiers.

Figure 5:
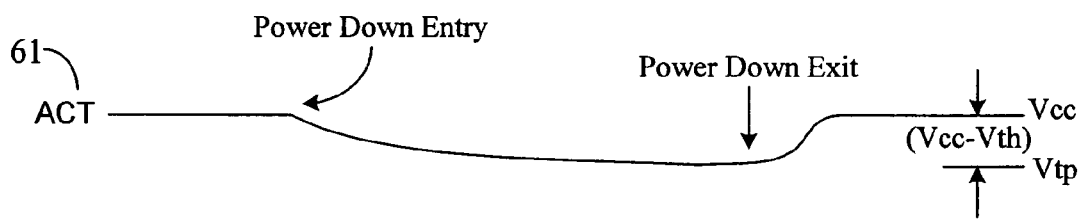
FIG. 5 depicts the voltage levels of the Psense amplifier control line prior to and during a power-down state in the circuit configuration of FIG. 4.

FIG. 5 depicts the voltage levels of the Psense amplifier control line (ACT 61) prior to and during a power-down state in the circuit configuration 75 of FIG. 4. As discussed hereinbefore, the ACT line 61 may be placed at Vcc level during a memory's active mode of operation (e.g., when the Normal 89 and PowerDn* 90 inputs in FIG. 4 are "high" or in logic "1" state). When the memory device (not shown) enters the power down mode (e.g., when the PowerDn* input 90 in FIG. 4 is asserted or held at a "low" or logic "0" level), however, the voltage level on the ACT node and line 61 may start to decrease from the Vcc level to the Vtp level (Vcc-Vth of NMOS 84A). The transition from the Vcc to Vtp level may not be abrupt because of the clamping action of the NMOS diode clamp 84A as can be seen from the waveform in FIG. 5. When the memory device (not shown) exits the power down mode (e.g., when the PowerDn* signal is de-asserted or "high" and the Normal mode input 89 is also held "high"), the ACT voltage level may again go back to its previous Vcc level because of the turning on of the PMOS transistor 80 and turning off of PMOS 87 (and, hence, turning off of the clamping device 84A) in the embodiment of FIG. 4.

Figure 6:
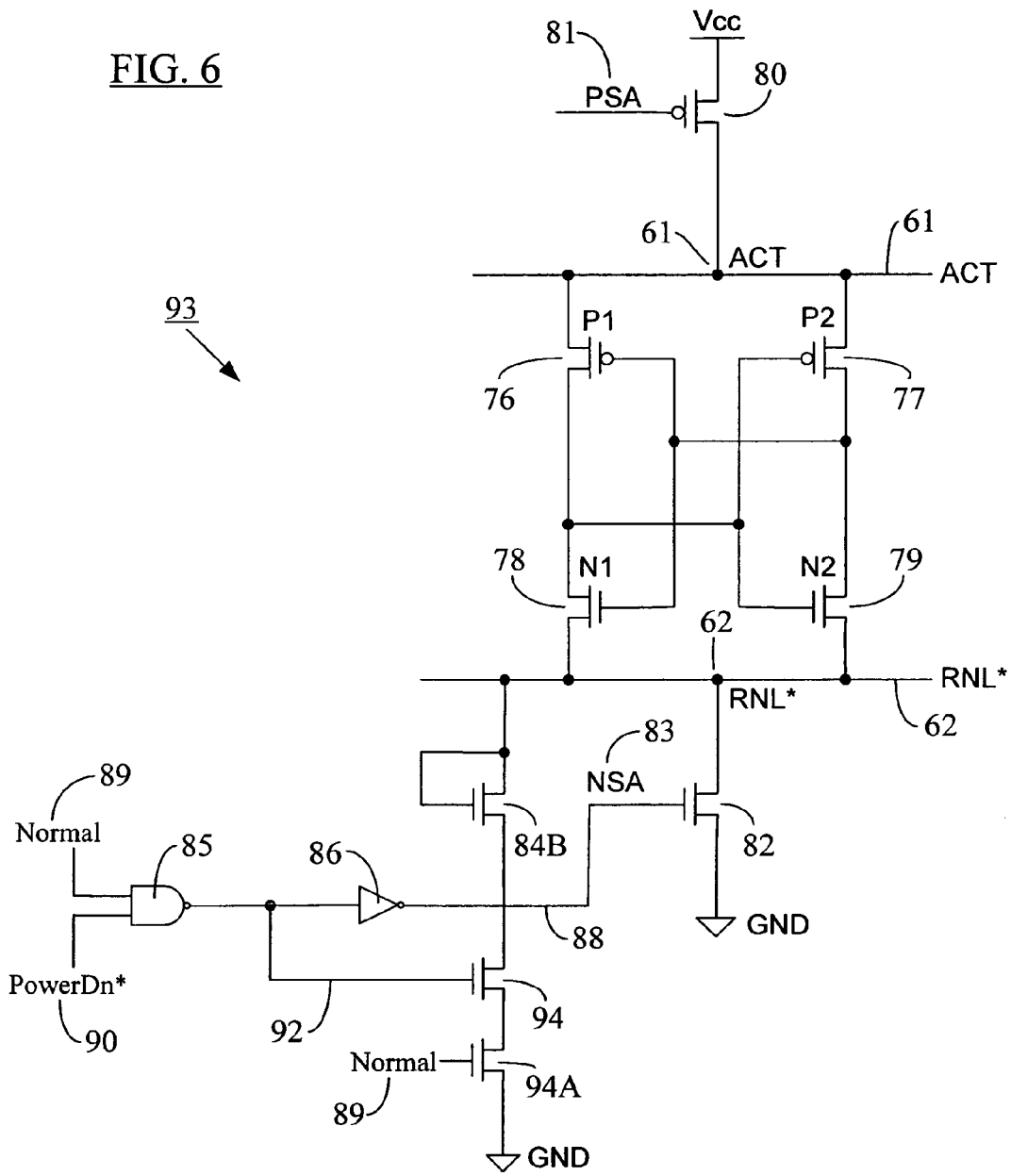
FIG. 6 shows an exemplary circuit configuration according to one embodiment of the present disclosure illustrating a clamping device-based power-down leakage current control mechanism for an Nsense amplifier control line.

FIG. 6 shows an exemplary circuit configuration 93 according to one embodiment of the present disclosure illustrating a clamping device-based power-down leakage current control mechanism for an Nsense amplifier control line (here, the RNL* line 62). Various circuit elements common between the circuit configurations 75 (FIG. 4) and 93 (FIG. 6) are denoted by same reference numerals. It is observed here that instead of placing the clamping device on the ACT line 61, as was the case in FIG. 4, the clamping device 84B in FIG. 6 is connected to the RNL* line 62. The NSA signal 83, being complementary in nature to the PSA signal 81, is now obtained at the output of the inverter 86 instead of at the output of the NAND gate 85 as was the case for the PSA signal 81 in FIG. 4. The output of the NAND gate 85, however, is here applied to the gate terminal of an NMOS transistor 94, which connects the NMOS clamp 84B to the system ground potential (GND) through an NMOS transistor 94A (whose gate terminal receives the Normal mode signal 89) as shown. The circuit configuration 93 for the RNL* line 62 may be considered "equivalent" to the circuit configuration 75 for the ACT line 61. Because of the substantial similarity in the construction and operation of the configurations 75 and 93, a detailed explanation of the operation of circuit 93 is not provided herein for the sake of brevity. It is briefly observed here that in the active (non-power down) mode, the NSA signal 83 is "high", thereby turning on the NMOS 82, which results in the RNL* node 62 having the ground potential (GND) thereon. In the power down mode, however, the PowerDn* input 90 is held "low", thereby bringing the NSA signal 83 to the "low" level and turning off the NMOS 82, but turning on the NMOS 94 because of a "high" level at the output 92 of the NAND gate 85. The activated NMOS 94 allows the clamping diode 84B to conduct through GND, thereby increasing the voltage at the RNL* node 62 from the ground potential (GND) to a Vtn level (=ground potential+Vth of NMOS 84B). The voltage at RNL* line 62 is eventually clamped at Vtn level so long as the memory device (not shown) is in the power down mode. A modest increase in the voltage on the RNL* line 62 from ground potential to the Vtn level results in a reduction of leakage current through RNL* node 62 (without any data loss) when sense amplifiers 76-79 are activated. A similar control or reduction in the value of the Idd3 current (e.g., from 50 mA to 20 mA) thus may be obtained using the configuration 93 of FIG. 6. As noted hereinbefore with reference to FIG. 4, a PMOS clamp-based circuit (not shown) may be connected to the Nsense amplifier control line 62 in FIG. 6 (with suitable circuit modifications apparent to one skilled in the art) instead of the NMOS clamp 84B based configuration.

Figure 8:
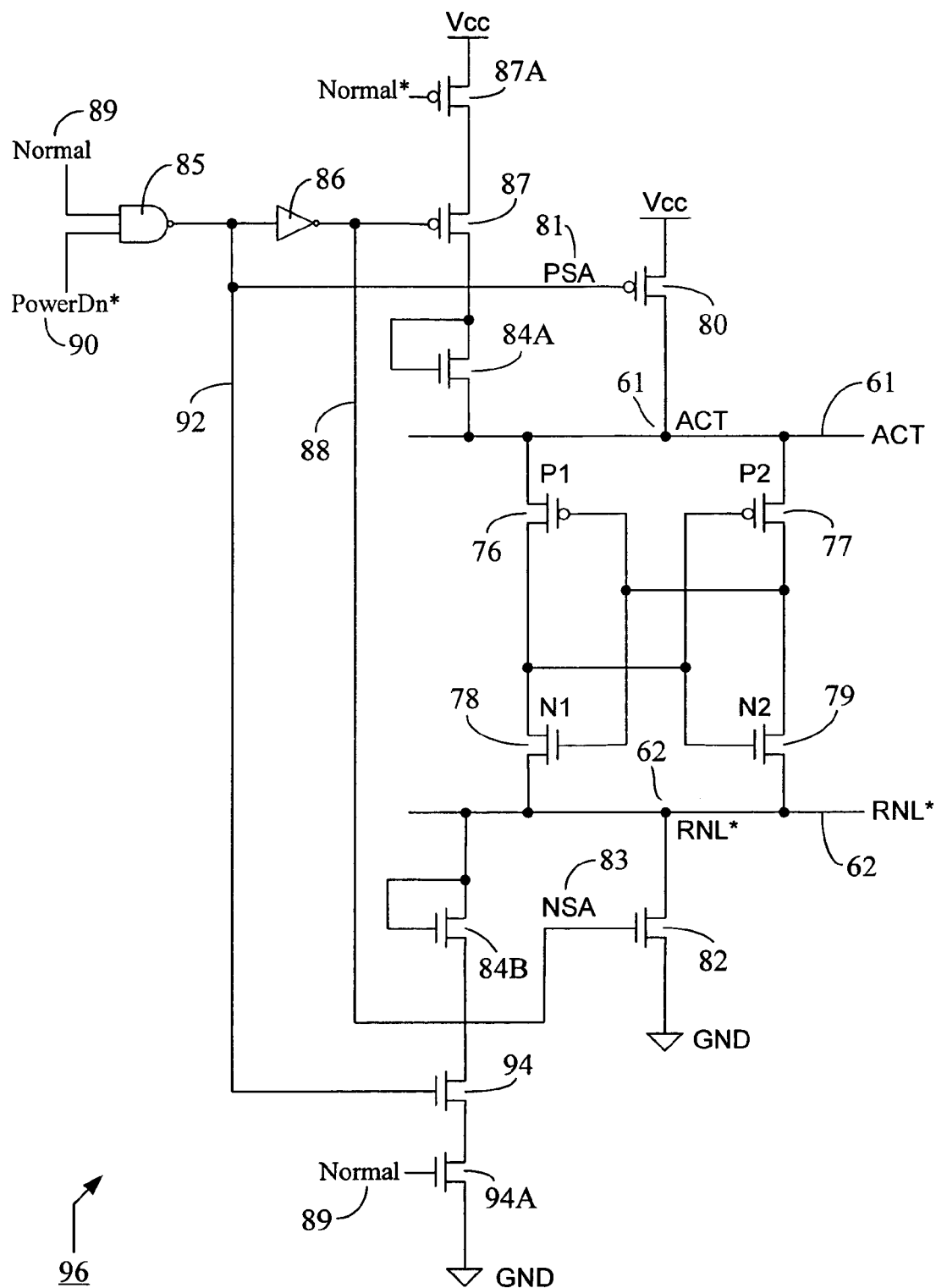
FIG. 8 illustrates a circuit configuration combining the circuit configurations of FIGS. 4 and 6 to provide suitable voltages to P and Nsense amplifier control lines to limit sense amplifier standby leakage currents during a memory power-down state.

It is observed here that the clamping diode-based circuit configurations in FIGS. 4, 6, and 8 may be implemented, along with the corresponding NAND-inverter-based or similar logic control circuit, on a memory chip (not shown) with minimal usage of semiconductor real estate. Therefore, the sensing scheme with current reduction methodology according to the teachings of the present disclosure can be implemented without significant modifications to the existing sense amplifier layout in a memory chip and without any complex data loss prevention measures.

Figure 7:
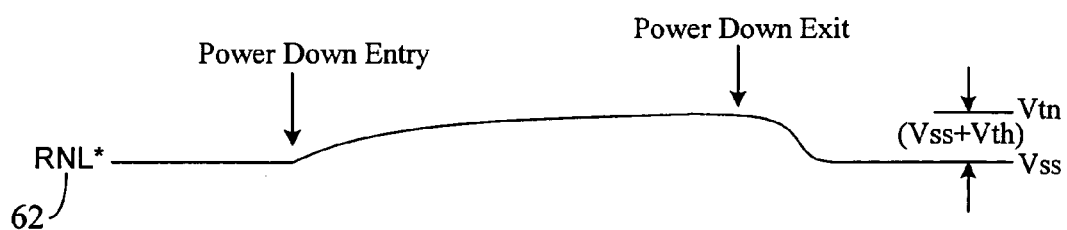
FIG. 7 depicts the voltage levels of the Nsense amplifier control line prior to and during a power-down state in the circuit configuration of FIG. 6.

FIG. 7 depicts the voltage levels of the Nsense amplifier control line (RNL*62) prior to and during a power-down state in the circuit configuration 93 of FIG. 6. As discussed hereinbefore, the RNL* line 62 may be placed at GND level during a memory's active mode of operation (e.g., when the Normal 89 and PowerDn* 90 inputs in FIG. 6 are "high" or in logic "1" state). In the embodiment of FIG. 7, the GND potential may be equal to the memory chip's substrate voltage (Vss). When the memory device (not shown) enters the power down mode (e.g., when the PowerDn* input 90 in FIG. 6 is asserted or held at a "low" or logic "0" level), however, the voltage level on the RNL* node and line 62 may start to increase from the Vss level to the Vtn level (Vss+Vth of NMOS 84B). The transition from the Vss to Vtn level may not be abrupt because of the clamping action of the NMOS diode clamp 84B as can be seen from the waveform in FIG. 7. When the memory device (not shown) exits the power down mode (e.g., when the PowerDn* signal is de-asserted or "high" and the Normal mode input 89 is also held "high"), the RNL* voltage level may again go back to its previous Vss level because of the turning on of the NMOS transistor 82 and turning off of NMOS 94 (and, hence, turning off of the clamping device 84B) in the embodiment of FIG. 6.

FIG. 8 illustrates a circuit configuration 96 combining the circuit configurations 75 and 93 of FIGS. 4 and 6, respectively, to provide suitable voltages to P and Nsense amplifier control lines 61-62, respectively, to limit sense amplifier standby leakage currents during a memory power-down state. By employing two clamping devices, e.g. NMOS clamp 84A for ACT line 61 and NMOS clamp 84B for RNL* line 62, additional reduction in sense amplifier leakage current during active power down mode may be obtained. A PMOS-based clamping devices may also be used (with suitable circuit modifications evident to one skilled in the art) in place of diodes 84A-84B as discussed hereinbefore. Furthermore, although a NAND gate 85 and inverter 86 are shown in FIG. 8 (and also in FIGS. 4 and 6) to obtain various activation signals at the outputs 88 and 92, other digital logic gates or analog circuit elements with similar functionality may be used to generate appropriate activation signals from the Normal 89 and PowerDn* 90 inputs as can be evident to one skilled in the art. Because the circuit configuration 96 is a combination of the circuit configurations 75 and 93 in FIGS. 4 and 6, respectively, and because of earlier discussion of FIGS. 4 and 6, no further discussion of the operation of the circuit configuration 96 in FIG. 8 is provided herein. The sense amplifier control line voltage level waveforms in FIG. 8 may be similar to the waveforms shown in FIGS. 5 and 7 as is evident to one skilled in the art.

Figure 1:
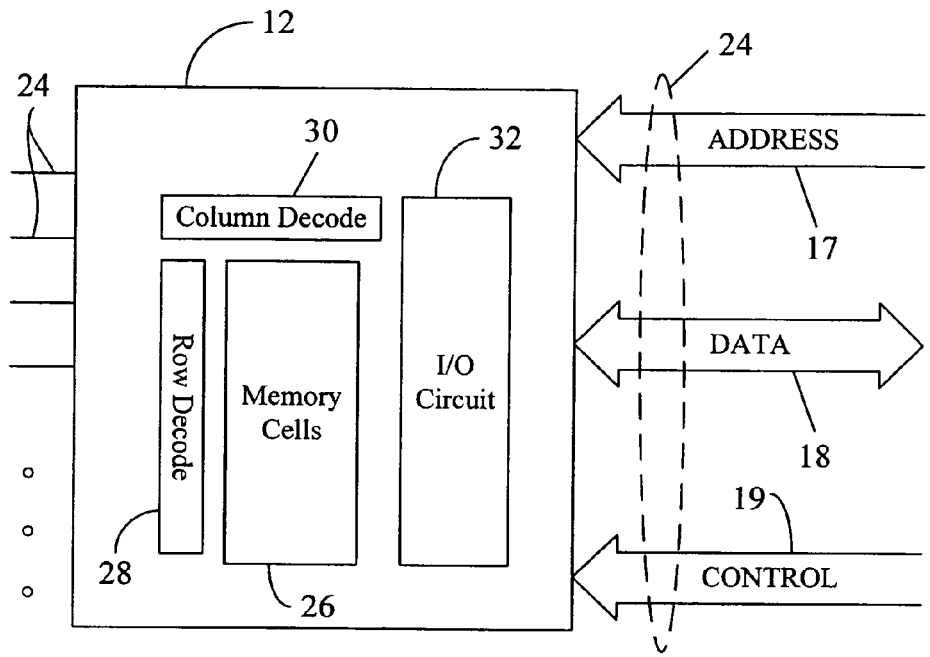
FIG. 1 is a simplified block diagram showing a memory chip or memory device.
Figure 2:
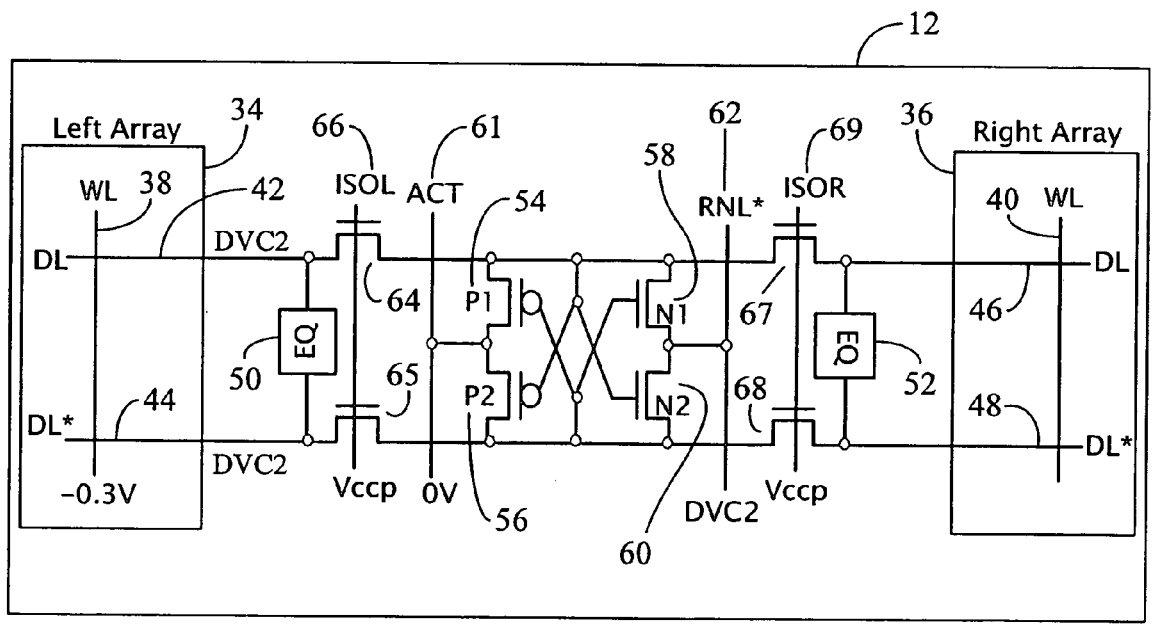
FIG. 2 is a simplified architecture for a portion of the memory device shown in FIG. 1.
Figure 9:
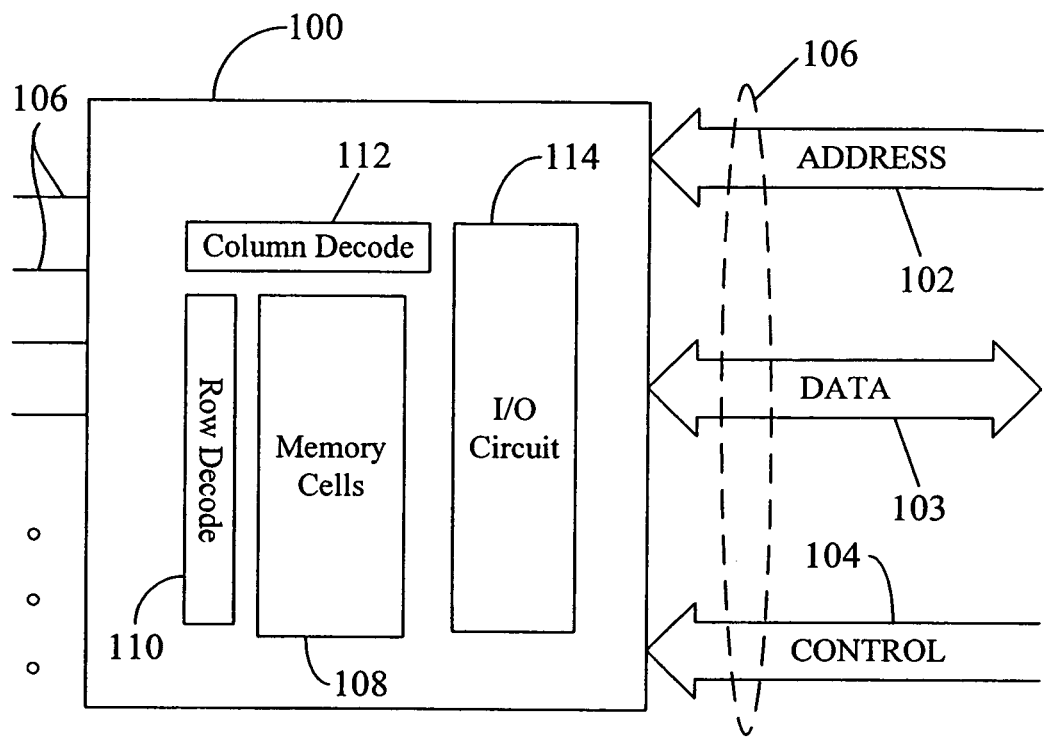
FIG. 9 is a simplified block diagram showing a memory chip that employs the circuit configurations of FIGS. 4 or 6 or 8.

FIG. 9 is a simplified block diagram showing a memory chip 100 that employs the circuit configurations of FIGS. 4 or 6 or 8. The memory chip 100 includes an address bus 102, a data bus 103, and a control bus 104, which are all part of the pins 106. For the sake of simplicity, all the pins on the memory chip 100 are designated by the same reference numeral "106." Similar to the memory chip 12 of FIG. 1, the memory chip 100 in FIG. 9 also includes a memory cell array 108 where memory cells are organized into rows and columns (which may be divided into a right array and left array as shown in FIG. 2), a row decode unit 110, a column decode unit 112, and an I/O unit 114, and additional circuits (not shown). Because of the substantial similarity between the architectures and functionality of the memory chip 12 (FIG. 1) and the memory chip 100 (FIG. 9), additional discussion of the constituent blocks in the memory chip 100 is not provided herein. It is noted, however, that the memory chip 100 includes one of the circuit configurations 75 (FIG. 4), 93 (FIG. 6), or 96 (FIG. 8) depending on the desired implementation for sense amplifier control line clamping during memory's 100 active power down mode. The chosen circuit configuration may be implemented through various memory blocks in the chip 100 in conformity with the general memory architecture illustrated in FIG. 2. For example, if the circuit configuration 75 in FIG. 4 is employed as part of the memory architecture of the chip 100, then a portion (e.g., the NAND gate 85 and the inverter 86) of the circuit configuration 75 be part of the I/O circuit 114, whereas the sense amplifiers 76-79, their driver transistors 80, 82, and the clamping circuit elements 84A and 87 may be part of the memory's sense amplifier unit (not shown). The exact location or placement of various circuit elements/ signals illustrated in FIGS. 4, 6, or 8 within the memory chip 100 is not relevant.

The memory chip 100 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 80 is a DDR DRAM operating at a clock frequency of 333 MHz and an I/O data rate of 667 MHz. It is noted here that although various architectural elements in the memory chip 100 and the chip 12 in FIG. 1 overlap or are functionally similar, it may be possible that those components having same or similar functionality may not be identical in the memories 12 and 100 because of the presence of low-Vth transistors for the sense amplifiers in the memory 100 and also the usage of different power down voltage levels for the ACT 61 and RNL*62 signals in the memory 100 in FIG. 9.

Figure 10:
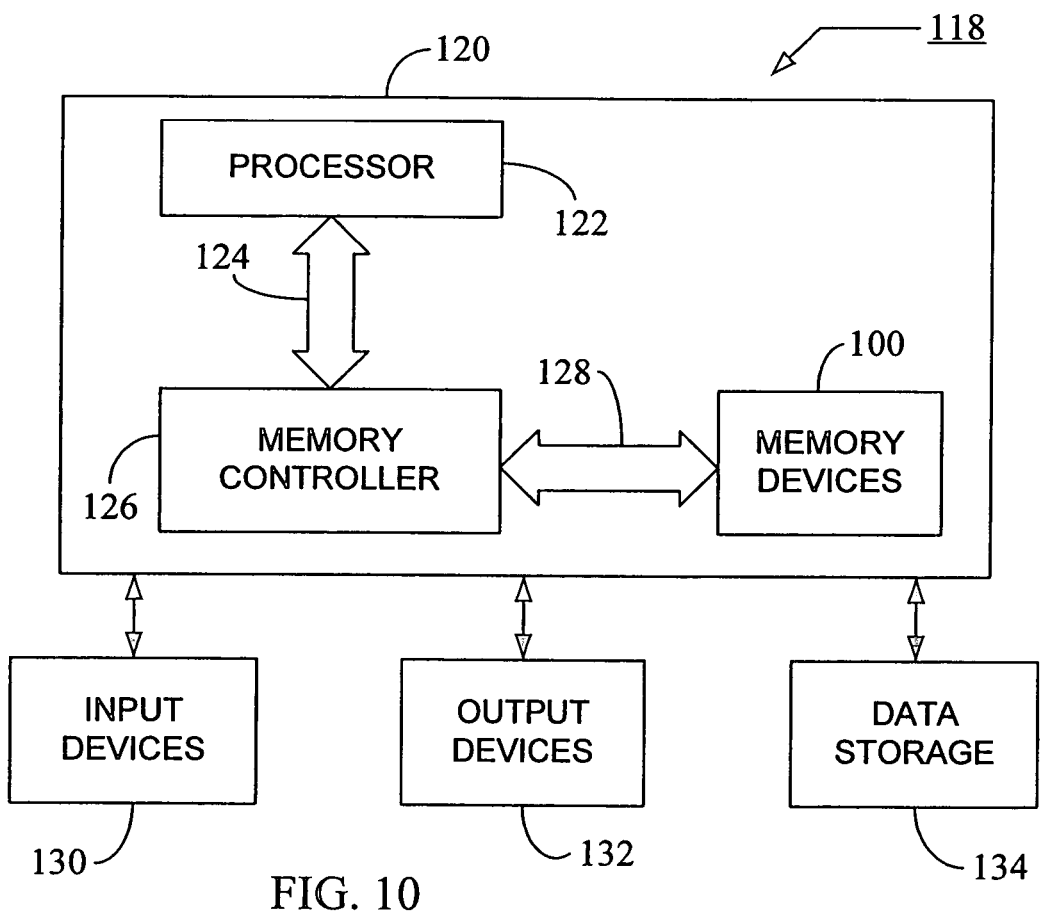
FIG. 10 is a block diagram depicting a system in which one or more memory chips illustrated in FIG. 9 may be used.

FIG. 10 is a block diagram depicting a system 118 in which one or more memory chips 100 illustrated in FIG. 9 may be used. The system 118 may include a data processing unit or computing unit 120 that includes a processor 122 for performing various computing functions, such as executing specific software to perform specific calculations or data processing tasks. The computing unit 120 also includes a memory controller 126 that is in communication with the processor 122 through a bus 124. The bus 124 may include an address bus (not shown), a data bus (not shown), and a control bus (not shown). The memory controller 126 is also in communication with a set of memory devices 100 (i.e., multiple memory chips 100 of the type shown in FIG. 9) through another bus 128 (which may be similar to the bus 106 shown in FIG. 9). Each memory device 100 may include appropriate data storage and retrieval circuitry (not shown in FIG. 10) as shown in FIG. 9. The processor 122 can perform a plurality of functions based on information and data stored in the memories 100.

The memory controller 126 can be a microprocessor, digital signal processor, embedded processor, micro-controller, dedicated memory test chip, a tester platform, or the like. The memory controller 126 may control routine data transfer operations to/from the memories 100, for example, when the memory devices 100 are part of an operational computing system 120. The memory controller 126 may reside on the same motherboard (not shown) as that carrying the memory chips 100. Various other configurations of electrical connection between the memory chips 100 and the memory controller 126 may be possible. For example, the memory controller 126 may be a remote entity communicating with the memory chips 100 via a data transfer or communications network (e.g., a LAN (local area network) of computing devices).

The system 118 may include one or more input devices 130 (e.g., a keyboard or a mouse) connected to the computing unit 120 to allow a user to manually input data, instructions, etc., to operate the computing unit 120. One or more output devices 132 connected to the computing unit 120 may also be provided as part of the system 118 to display or otherwise output data generated by the processor 122. Examples of output devices 132 include printers, video terminals or video display units (VDUs). In one embodiment, the system 118 also includes one or more data storage devices 134 connected to the data processing unit 120 to allow the processor 122 to store data in or retrieve data from internal or external storage media (not shown). Examples of typical data storage devices 134 include drives that accept hard and floppy disks, CD-ROMs (compact disk read-only memories), and tape cassettes. As noted before, the memory devices 100 in the computing unit 120 have the configuration illustrated in FIG. 9, i.e., each memory device 100 may include one of the circuit configurations illustrated in FIGS. 4, 6, or 8 as discussed before.

It is observed that although the discussion given hereinabove has been primarily with reference to memory devices, it is evident that the active power down standby current reduction methodology discussed hereinbefore with reference to FIGS. 4-8 may be employed, with suitable modifications which may be evident to one skilled in the art, in any other electronic device that may have data storage elements and utilize a memory array-type architecture discussed with reference to the memory chip embodiments in FIGS. 4, 6, and 8. The reduction in power down standby current in such data storage elements in such an electronic device may be obtained using the clamping device-based voltage control mechanisms discussed hereinabove or a methodology similar in principle as may be evident to one skilled in the art.

The foregoing describes a low voltage sensing scheme that reduces active power down standby leakage current in a memory device. During memory's active power down state, the leak current may increase because of the use of P and Nsense amplifiers having low threshold voltages (Vth) for low Vcc sensing of data signals. A clamping device or diode is used between a Psense amplifier control line (ACT) and Vcc and/or between an Nsense amplifier control line (RNL*) and Vss (ground potential). The clamping diode is not enabled during normal memory operations, but is turned on during active power down mode to reduce leakage current through ACT and/or RNL* nodes. The clamping device connected to the ACT node may reduce the voltage on the ACT line during power down mode, whereas the clamping device connected to the RNL* node may increase the voltage on the RNL* line during power down mode to reduce sense amplifier leakage current through these nodes. The voltages on ACT and RNL* lines go back to their original levels when the memory device exits the power down mode. The reduction in the active power down standby leakage current further reduces the overall Icc current consumption from the memory circuit's supply or operating voltage Vcc, thereby reducing the memory chip's overall power consumption. Further, clamping devices can be implemented without significant modifications to the sense amplifier layout in a memory chip and without any complex data loss prevention measures.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating a circuit within a memory device, comprising:

maintaining a first voltage level on a sense amplifier control line in said memory device before placing said memory device in a power down mode;

maintaining a voltage clamping device turned off before placing said memory device in a power down mode, wherein said voltage clamping device is turned off by disconnecting a terminal of said voltage clamping device; and upon placing said memory device in said power down mode, applying a second voltage level to said sense amplifier control line using said voltage clamping device connected to said sense amplifier control line.

2. The method of claim 1, wherein said sense amplifier control line is a Psense amplifier control line, said first voltage level is a high voltage level, and said second voltage level is equal to said high voltage level reduced by a threshold voltage of said clamping device.

3. The method of claim 2, wherein said high voltage level equals the level of a supply voltage to said memory device and wherein said clamping device is an NMOS (N-channel MOS) diode.

4. The method of claim 1, wherein said sense amplifier control line is an Nsense amplifier control line, said first voltage level is a low voltage level, and said second voltage level is equal to said low voltage level increased by a threshold voltage of said clamping device.

5. The method of claim 4, wherein said low voltage level equals the level of a ground potential for said memory device and wherein said clamping device is an NMOS (N-channel MOS) diode.

6. The method of claim 1, further comprising establishing said first voltage level on said sense amplifier control line when said memory device exits said power down mode.

7. A method of operating a circuit within a memory device, comprising:

generating a first signal to place a first voltage level on a sense amplifier control line in said memory device before placing said memory device in a power down mode;

maintaining a voltage clamping device turned off before placing said memory device in a power down mode, wherein said voltage clamping device is turned off by disconnecting a terminal of said voltage clamping device; and upon placing said memory device in said power down mode, generating a second signal to apply a second voltage level to said sense amplifier control line using said voltage clamping device connected to said sense amplifier control line.

8. The method of claim 7, wherein said generating said first signal comprises:

receiving a normal mode signal and a power down mode signal to place said memory device in a normal mode and in said power down mode, respectively; and using said normal mode signal and said power down mode signal to generate said first signal when said normal mode signal is asserted and said power down mode signal is not asserted.

9. The method of claim 7, wherein said generating said second signal comprises:

receiving a power down mode signal to place said memory device in said power down mode; and generating said second signal when said power down mode signal is asserted.

10. The method of claim 9, further comprising:

receiving a normal mode signal to place said memory device in a normal mode prior to entry into said power down mode; and generating said second signal when said power down mode signal is asserted, irrespective of the state of said normal mode signal.

11. A method of operating a circuit in a memory device, comprising:

maintaining a first voltage level on a sense amplifier control line in said memory device before placing said memory device in a power down mode;

maintaining a voltage clamping device turned off before placing said memory device in a power down mode, wherein said voltage clamping device is turned off by disconnecting a terminal of said voltage clamping device; and transitioning said first voltage level to a second voltage level using said voltage clamping device connected to said sense amplifier control line when said memory device is placed in said power down mode.

12. The method of claim 11, wherein said transitioning includes gradually changing said first voltage level to said second voltage level using said voltage clamping device.

13. The method of claim 11, further comprising returning said sense amplifier control line to said first voltage level from said second voltage level when said memory device exits said power down mode.

14. The method of claim 11, wherein said clamping device is a CMOS (Complementary MOS) transistor configured to operate as a clamping diode.

15. The method of claim 11, wherein said sense amplifier control line is a Psense amplifier control line, said first voltage level is a supply voltage level, and said second voltage level is equal to said supply voltage level reduced by a threshold voltage of said clamping device.

16. The method of claim 11, wherein said sense amplifier control line is an Nsense amplifier control line, said first voltage level is a ground potential, and said second voltage level is equal to said ground potential increased by a threshold voltage of said clamping device.

17. In a method of operating a solid state memory device of the type requiring a pair of Psense-amplifiers controlled by a Psense amplifier control line and a pair of Nsense-amplifiers controlled by an Nsense amplifier control line, wherein said Psense amplifier control line is held at a first voltage level and said Nsense amplifier control line is held at a second voltage level when said memory device is placed in a power down mode, the improvement comprising performing the following:

maintaining a first voltage clamping device and a second voltage clamping turned off before placing said memory device in a power down mode, wherein said first voltage clamping device and said second clamping device are turned off by disconnecting a terminal of said voltage clamping device;

reducing said first voltage level during said power down mode using said first voltage clamping device connected to said Psense amplifier control line; and increasing said second voltage level during said power down mode using said second voltage clamping device connected to said Nsense amplifier control line.

18. In the method of claim 17, said reducing includes reducing said first voltage level by a first threshold voltage of said first voltage clamping device, and said increasing includes increasing said second voltage level by a second threshold voltage of said second voltage clamping device.

* * * * *